United States Patent [19]

Bokor et al.

[11] Patent Number: 4,933,542

[45] Date of Patent: Jun. 12, 1990

[54] HIGH SPEED PHOTODETECTOR HAVING DUAL TRANSMISSION LINE GEOMETRY

[75] Inventors: Jeffrey Bokor, Holmdel; Anthony M. Johnson, Freehold, both of N.J.

[73] Assignee: AT&T Bell Laboratories, Murray Hill, N.J.

[21] Appl. No.: 265,160

[22] Filed: Oct. 31, 1988

[51] Int. Cl.$^5$ ............................................. H01J 40/14
[52] U.S. Cl. .................................. 250/211 J; 357/30
[58] Field of Search ................. 250/211 J, 578; 357/2, 357/30 H, 16, 15, 17, 14, 61, 74; 358/296

[56] References Cited

U.S. PATENT DOCUMENTS

| | | | |
|---|---|---|---|
| 3,917,943 | 11/1975 | Auston | 250/211 J |
| 3,947,681 | 3/1976 | Javan | 250/211 J |
| 4,127,784 | 11/1978 | Proud, Jr. et al. | 250/211 J |
| 4,326,126 | 4/1982 | Auston | 250/211 J |
| 4,376,285 | 3/1983 | Leonberger et al. | 357/30 H |
| 4,482,863 | 11/1984 | Auston et al. | 324/158 T |
| 4,525,871 | 6/1985 | Foyt et al. | 250/211 J |
| 4,703,996 | 11/1987 | Glass et al. | 350/96.11 |

OTHER PUBLICATIONS

Picosecond Optoelectronic Devices, edited by C. H. Lee, 1984, pp. 274-277.
Applied Physics Lett., "An Amorphous Silicon Photodetector for Picosecond Pulses", D. H. Auston et al., 36 (1), Jan. 1980.
Applied Physics Lett., "Picosecond Optoelectronic Detection, Sampling and Correlation Measurements in Amorphous Semiconductors", D. H. Auston et al., 37(4), Aug. 1980, p. 371.
Applied Physics Lett., "Picosecond Photoconductivity in Radiation-Damaged Silicon-on-Sapphire Films", P. R. Smith et al., 38(1), Jan. 1981, pp. 47-50.
Applied Physics Lett., "Picosecond Optical Electronic Sampling: Characterization of High-Speed Photodetectors", D. H. Auston et al., 41(7), Oct. 1982, pp. 599-601.
Applied Physics Lett., "High Quantum Efficiency Amorphous Silicon Photodetectors with Picosecond Response Times", 44(4), Feb. 1984, pp. 450-452.
Applied Physics Lett., "Subpicosecond Optoelectronic Study of Resistive and Superconductive Transmission Lines", W. J. Gallagher et al., 50(6), Feb. 1987, pp. 350-351.
Applied Physics Lett., "Generation of Subpicosecond Electrical Pulses on Coplanar Transmission Lines", M. B. Ketchen et al., 48(12), Mar. 1986, pp. 751-753.
Applied Physics Lett., "Far Infrared Spectroscopy with Subpicosecond Electrical Pulses on Transmission Lines", R. Sprik et al., 51(7), Aug. 1987, pp. 548-551.
IEEE Trans. on Magnetics, "Subpicosecond Optoelectronic Study of Superconducting Transmission Lines", C. C. Chi et al., vol. MAG-23, No. 2, Mar. 1987, pp. 1666-1669.
IEEE Journal of Quantum Electronics, "Capacitance Free Generation and Detection of Subpicosecond Electrical Pulses on Coplanar Transmission Lines", D. R. Grischkowsky et al., vol. 24, No. 2, Feb. 1988, pp. 221-225.

*Primary Examiner*—David C. Nelms
*Attorney, Agent, or Firm*—Gregory C. Ranieri

[57] ABSTRACT

A vacuum photodetector has been fabricated in a coplanar microstrip transmission line geometry to achieve high quantum efficiency and picosecond response time. The coplanar microstrip transmission lines, photocathode and anode, are mounted on an insulating substrate such as sapphire and are electrically biased with respect to each other. Photodetection occurs by classical photoelectric emission as a result of impinging photon energies exceeding the work function of the photocathode.

16 Claims, 2 Drawing Sheets

HIGH SPEED PHOTODETECTOR HAVING DUAL TRANSMISSION LINE GEOMETRY

TECHNICAL FIELD

This invention relates to the field of detection of optical signals and, more particularly, to photodetection of ultrafast pulses by employing microstrip transmission lines.

BACKGROUND OF THE INVENTION

Optoelectronic devices have been used to generate and detect picosecond and subpicosecond pulses. One popular type of device includes coplanar strip transmission lines deposited over photoconductive material such as ion-implanted (radiation damaged) silicon-on-sapphire. In such a device, the pulses are generated when a charged transmission line is temporarily shorted by carriers excited within the photoconductive material. Minimum electrical pulse width is determined by the lifetime of photoexcited carriers in the photoconductive material. Examples of photoconductive detectors are shown in articles by D. H. Auston et al., *Appl. Phys. Lett.*, 36 (1), pp. 66-8 (1980); D. H. Auston et al., *Appl. Phys. Lett.*, 37 (4), pp. 371-2 (1980); P. R. Smith et al., *Appl. Phys. Lett.*, 38 (1), pp. 47-50 (1981); W. G. Gallagher et al., *Appl. Phys. Lett.*, 50 (6), pp. 350-2 (1987); and M. B. Ketchen et al., *Appl. Phys. Lett.*, 48 (12), pp. 751-3 (1986).

For coplanar transmission lines on a photoconductive substrate, response or "rise time" of the photoconductive detector is in the picosecond regime while quantum efficiencies for such a detector are quite low. In the prior art, it is only the streak camera which has offered both fast response times and high sensitivity. However, usefulness of the streak camera is offset by its high cost in relation to the formerly described transmission line devices.

SUMMARY OF THE INVENTION

Picosecond response time, high quantum efficiency, low cost and small size are afforded by a photodetector comprising parallel transmission lines mounted on an insulating substrate such as sapphire. The transmission lines are biased with respect to each other so that one line acts as a cathode while the other acts as an anode. Photons impinging on the cathode cause photoelectric emission to occur. A resulting photocurrent is available for use in external circuitry. Sensitivity of the photodetector may be improved by coating one transmission line (photocathode) with commercially available photocathode material such as cesium.

Microfabrication techniques are employed to make the photodetector because devices dimensions are on the order of microns.

BRIEF DESCRIPTION OF THE DRAWING

A more complete understanding of the invention may be obtained by reading the following description of specific illustrative embodiments of the invention in conjunction with the appended drawings in which.

DETAILED DESCRIPTION

Photodetectors having fast response times, on the order or picoseconds or faster, have been reported wherein coplanar strip transmission lines are mounted on a photoconductive substrate and perform detection by a photoconductive process. In such photoconductive detectors, photons impinging on the photodetector cause the transmission lines to be shorted together because excited carriers are caused to flow in the photoconductive material.

Figure 1:
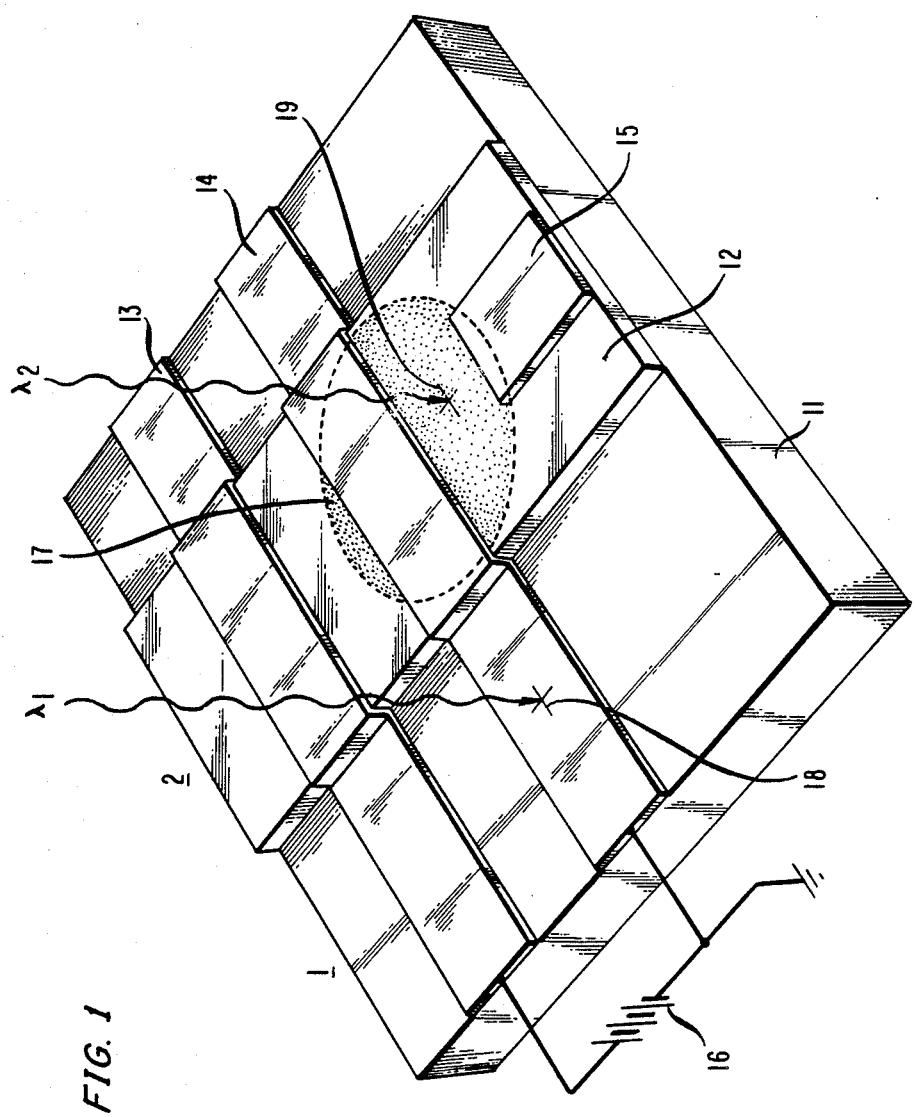
FIG. 1 shows a perspective view of a photodetector in accordance with the principles of the invention wherein the photodetector is combined with a photoconductive sampling gate.

FIG. 1 shows a photodetector in accordance with the principles of the invention. The photodetector is shown in combination with a photoconductive sampling gate. Photodetector 1 and sampling gate 2 are fabricated on substrate 11.

The present photodetector employs the photoelectric effect in a micron-scale device to provide comparable response as, and higher sensitivity than, predecessor photoconductive detector devices. Picosecond response time, high quantum efficiency, low cost small size are afforded by the present photodetector comprising parallel microstrip conductive transmission lines mounted on an insulating substrate such as sapphire. The microstrip transmission lines are biased with respect to each other so that one line acts as a cathode while the other acts as an anode. Photons impinging on the cathode cause photoelectric emission of electrons to occur wherein the energy of the impinging photons exceeds the work function of the material comprising the cathode. A resulting photocurrent is available for use in external circuitry such as sampling gates and the like.

Photodetector 1 comprises parallel, spaced-apart coplanar transmission lines 13 and 14 formed on insulating substrate 11 and biased electrically with respect to each other by voltage source 16. Sampling gate 2 comprises a sampling electrode 15 and at least one of the coplanar transmission lines wherein both the electrode and the at least one coplanar transmission line are formed over photoconductive region 17 in material layer 12 on substrate 11.

Figure 2:
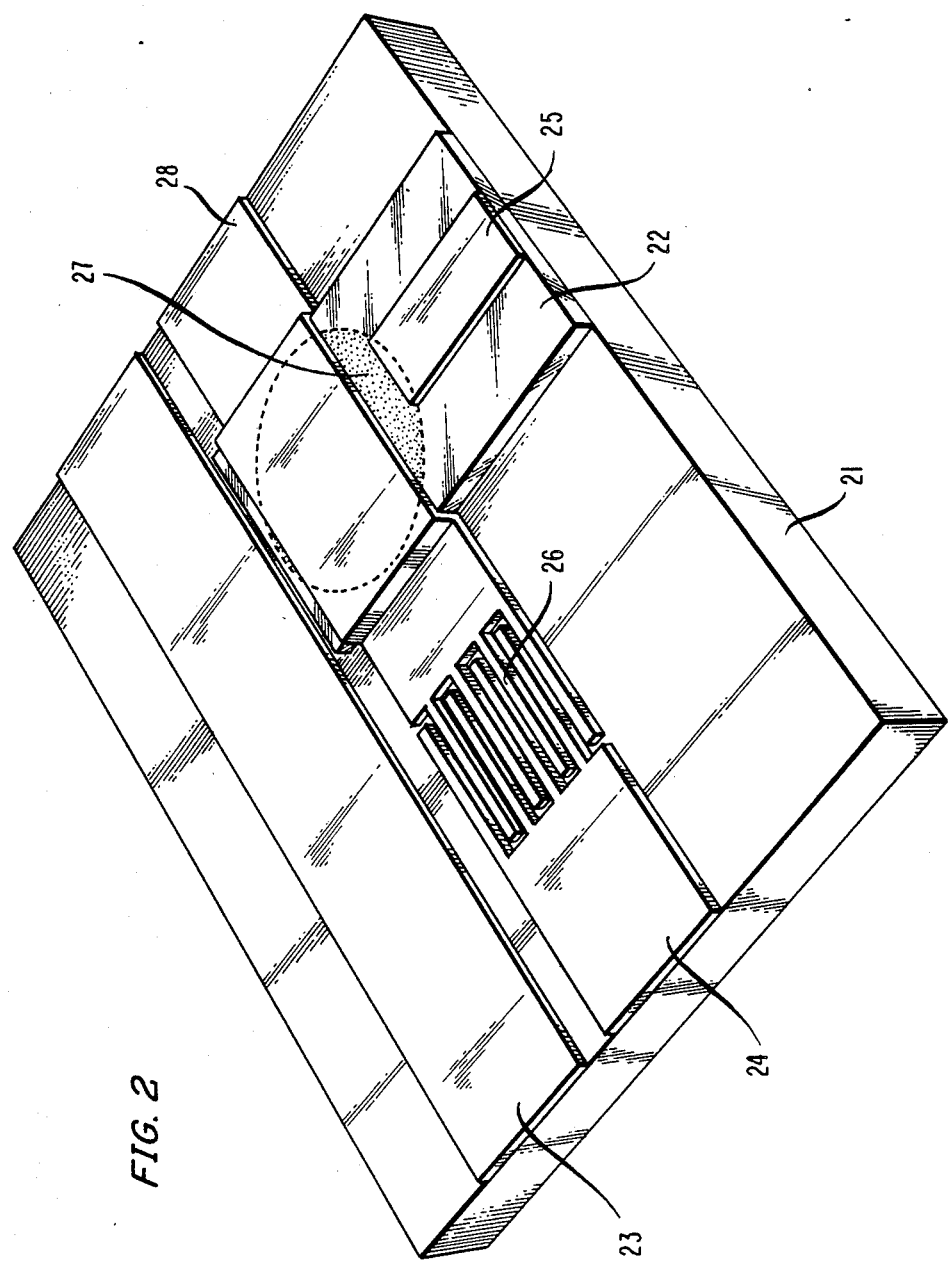
FIG. 2 shows a perspective view of a photodetector incorporating an interdigitated structure accordance with the principles of the invention wherein the photodetector is combined with a photoconductive sampling gate.

In FIGS. 1 and 2, photoconductive sampling gates have been shown as the external circuit to which the electrical pulse is supplied. Clearly, connection may be made to other sampling devices such as high speed sampling oscilloscopes or to other utilization circuits. It should be noted that, where sampling gates are to be used, it is often desirable to integrate the photodetector and sampling gate on the same substrate as is shown in FIGS. 1 and 2. In general, sampling gates have been fabricated on amorphous or polycrystalline films such as radiation damaged silicon and the like. See U.S. Pat. No. 4,482,863 for an exemplary sampling gate.

Substrate materials for use in the present photodetector are selected from well known insulating materials such as silicon dioxide (glass, quartz), sapphire, lithium niobate, lithium tantalate, semi-insulating semiconductors (e.g., Fe:InP) and the like. Selection of a substrate material is based upon considerations such as optoelectronic integration of the photodetector with other devices on the same substrate and ease of fabrication, to name a few.

In order to fabricate the device shown in FIG. 1, layer 12 is deposited or grown over the entire substrate 11 and is then removed from that region including photodetector 1. Alternatively, standard photolithographic masking and chemical etching processes may be applied to facilitate deposition or growth of layer 12 only in the region to be occupied by sampling gate 2. In the present device, the width of the sampling region occupied by layer 12 is approximately 12 mm.

In the region occupied by sampling gate 2, layer 12 is activated to exhibit photoconductivity and, thereby, ensure high speed material for the sampling gap region. For the present device, 2 MeV Ar+ ions cause radiation damage on silicon layer 12 to provide photoconductivity in the layer. Activation of layer 12 is generally confined to a predetermined photoconductive region 17 in the vicinity of sampling target 19 as depicted by the dashed circular region (sampling gap region) enclosing the stipple marks. Photoconductive region 17 includes sampling target 19 and the gap formed between coplanar transmission line 14 and sampling electrode 15.

Conductive transmission lines 13 and 14 are formed in parallel, spaced-apart relationship on substrate 11 for photodetector 1 and continuing over layer 12 for sampling gate 2. Sampling gate electrode 15 is formed on layer 12 generally overlapping a portion of the activated region of layer 12.

Coplanar, conductive transmission lines 13 and 14 are generally referred to as microstrip transmission lines because of their small dimensions. Conductive materials such as metals are selected for use as transmission line material based upon factors such as conductivity (resistivity) and ease of application, as well as other factors. Thicknesses for the microstrip transmission lines are chosen to be sufficient to lower the series resistance for pulses traveling along the microstrip line. Considerations for the thickness of the microstrip transmission lines must also be in conjunction with similar considerations for transmission line width and separation between the microstrip transmission lines because the ratio between the width of each transmission line to the separation therebetween is proportional to the line impedance. In an example from experimental practice, 5 $\mu$m wide, gold microstrip lines are electroplated onto substrate 11 to a thickness of 1 $\mu$m and an interline spacing of 5 $\mu$m under plating conditions chosen to yield a roughened surface for enhancing the photoelectric yield of photodetector 1. Sampling electrode 15 was formed at a 25 $\mu$m width and separated from transmission line 14 by approximately 10 $\mu$m as the sampling gap. Patterning is accomplished by standard photolithographic and chemical etching techniques. A further increase in photoelectric yield is obtained by coating at least the surface of conductive transmission line 14 with a thin film of photocathode material to decrease the photocathode work function. Such photocathode material is selected for the particular range of wavelengths being detected and includes cesium. Photocathode material is applied to a few monolayer thicknesses by in situ evaporation.

An optical signal at wavelength $\lambda_1$ comprising ultrafast pulses is focussed onto detection target 18. Ultrafast pulses of light at wavelength $\lambda_2$ are focussed onto sampling target 19 to trigger the sampling gap. In one experiment, UV laser pulses at 266 nm. and having approximately 500 fsec. duration were focussed onto detection target 18 whereas 532 nm. compressed pulses having less than 500 fsec. duration were focussed onto sampling target 19. The former pulses were derived from a cw modelocked Nd:YAG laser produced by subsequent second harmonic generation using a 1 mm. thick beta-barium borate (BBO) crystal. Second harmonic light from the laser was used with a pulse compressor to produce the latter pulses. Rise times of approximately 4 psec. and fall times of approximately 10 psec. were observed for photodetector 1. Focussed beam spot sizes were approximately 5 $\mu$m.

As described above, an electric field is imposed between the coplanar transmission lines via source 16 to operate the device. Applied voltage is determined to be less than the voltage required to cause avalanche breakdown of the material comprising substrate 11. For a transmission line separation of 5 $\mu$m on a silicon substrate, the maximum applied voltage is approximately 60 volts.

Photodetectors operating in this high speed regime must exhibit rapid rise and fall times to match closely the characteristics of the signal pulses being detected. It has been found experimentally that the applied bias does not cause any significant variation of the rise time. While the rise time is substantially independent of applied bias voltage, it has been found experimentally that the applied bias causes the fall time of the signal detected by the photodetector shown in FIG. 1 to vary inversely with the square root of the applied bias voltage. Such a dependence is the expected behavior for the electron transit time in a vacuum diode.

In order to better understand the mechanism governing the dependence of all time on applied bias voltage, it is possible to calculate potential distribution and electron trajectories. A large component of the applied electric field is normal to the surface of transmission line 14 causing electrons to travel out of and away from the transmission lines rather than curving sharply back to the anode as expected. The fall time of a pulse generated on the transmission line is therefore controlled by flight time of electrons through a near-field region. Upon further experimentation, it has been deduced that fall time is determined by the transit time of photoelectrons traveling out to a distance of several times the transmission line separation.

It is expected that, for a device of the type shown in FIG. 1 operated at a bias voltage in the range from 100–150 volts, the device would exhibit a fall time of less than 5 psec. Since the material between the coplanar transmission lines controls the magnitude of the bias applied to the transmission lines, elimination of the material in the separation region between the transmission lines will permit significantly higher electric fields to be applied to the transmission lines. Of course, for an integrated sampling gate, it would be necessary to maintain the material within the sampling region.

In addition to a decreasing fall time with increasing bias voltage, it has been found experimentally that detected signal magnitude increase linearly with increasing bias voltage. This is apparently indicative that the emitted current from transmission line 14 (cathode) is space charge limited. It is expected that at some point the linear dependence subsides as saturation is reached.

Pulse dispersion on the transmission lines does not appear because the distance from the detection target 18 in photodetector 1 to the sampling gate near sampling target 19 is reasonably small on the order of several millimeters.

As stated above, the present photodetector has been operated in the UV wavelength regime. Since UV and shorter wavelength soft X-ray radiation is readily absorbed by many materials, it is preferred that the photodetector be placed in a container maintained with a relatively low vacuum. In experimental practice, the vacuum was maintained at a base pressure of $2\times 10^{-6}$ torr. It should be noted that the preference for an evacuated atmosphere in which to operate the photodetector is based on the transmission line design shown in FIG. 1 wherein the device parameters are on the order of the elastic scattering length for photoemitted electrons ($\approx 5$ μm). On the other hand, the smaller scale design rules for the interdigitated structure shown in FIG. 2 may permit operation of the photodetector at standard atmospheric pressure provided wavelengths longer than UV are detected because the spacing between adjacent lines in the interdigitated structure is significantly less than the elastic scattering length.

Origin of the generated electrical pulse as being produced via the photoelectric effect has been confirmed by venting the vacuum chamber enclosing at least the microstrip transmission lines and observing that the generated signal disappears. This disappearance is due to photoemitted electron scattering by air molecules.

Bandwidth of the present photodetector is extremely wide. As a result, speed of response for the photodetector is no longer limited by the circuit. Instead, speed of response is limited by the transit time of photoemitted electrons. It is expected that transit times can be made to approach 1 psec. with proper microstrip transmission line spacing and sufficiently high bias potential between the transmission lines.

An alternative embodiment of the photodetector in accordance with the principles of the invention is shown in FIG. 2. The photodetector is shown integrated with a photoconductive sampling gate. As shown in FIG. 2, the photodetector includes an interdigitated electrode structure within one of the microstrip transmission lines.

The photodetector of FIG. 2 includes coplanar, conductive, microstrip transmission lines 23 and 24 with 28, the latter two together with interdigitated electrode structure 26, all on insulating substrate 21. Coplanar transmission lines 23 and 24 are separated from each other in substantially parallel relationship. The interdigitated electrode structure 26 is formed between and by ends of transmission lines 24 and 28.

A sampling gate is integrated with the photodetector. The sampling gate includes sampling electrode 25 on photoconductive layer 22 separated from transmission line 28 in sampling region 27 as depicted by the dashed circle. In contrast to the sampling gate shown in FIG. 1, the sampling gate shown in FIG. 2 has photoconductive material in layer 22 which extends only under transmission line 28 and sampling electrode 25.

In an exemplary embodiment, transmission lines 24 and 28 are separated from transmission line 23 by approximately 25 μm. The sampling gap between sampling electrode 25 and transmission line 28 is also 25 μm. Interdigitated electrode structure 26 is approximately 75 μm long as measured between facing ends of transmission lines 24 and 28. For 50 μm transmission line widths, the interdigitated electrodes should be approximately 1 or 2 μm wide with approximately 1 or 2 μm interelectrode spacing which permits approximately twelve or six interdigitated electrode fingers to protrude from each transmission line. For 100 μm transmission line widths, the interdigitated electrodes should be approximately 1 μm wide with approximately 1 μm interelectrode spacing which permits approximately twenty five interdigitated electrode fingers to protrude from each transmission line. Of course, other combinations of electrode finger widths and interelectrode spacings can be made for various reasons.

We claim:

1. Photodetector for generating an electrical waveform in response to illumination by an optical signal, said photodetector including,
    a substrate comprising substantially insulating material,
    first and second conductive transmission lines mounted in substantially parallel, spaced-apart relationship on said substrate,
    means for contacting an electrical potential between said first and second conductive transmission lines,
    said first conductive transmission line responsive to illumination in a predetermined target region by said optical signal for generating said electrical waveform by photoelectric emission.

2. The photodetector defined in claim 1 wherein said first and second conductive transmission lines are substantially coplanar.

3. The photodetector defined in claim 2 wherein a said first and second conductive transmission lines comprise an electrically conductive material and said first conductive transmission line includes an layer at least at said predetermined target region comprising photocathode material.

4. The photodetector defined in claim 3 wherein said substrate includes a first layer comprising sapphire.

5. The photodetector defined in claim 1 wherein, at least in the vicinity of said predetermined target region, both said first conductive transmission line includes first and second sections being electrically isolated from each other and each of said first and second sections having one end formed as a plurality of spaced apart, interdigitated electrode fingers, alternate ones of said plurality of interdigitated electrode fingers extending from said first section.

6. The photodetector defined in claim 5 wherein said first and second conductive transmission lines are substantially coplanar.

7. The photodetector defined in claim 6 wherein a said first and second conductive transmission lines comprise an electrically conductive material and said first conductive transmission line includes an layer at least at said predetermined target region comprising photocathode material.

8. The photodetector defined in claim 7 wherein said substrate includes a first layer comprising sapphire.

9. The photodetector defined in claim 8 wherein adjacent ones of said interdigitated electrode fingers are equally spaced apart, one from the other.

10. The photodetector defined in claim 8 wherein adjacent ones of said interdigitated electrode fingers are equally spaced apart, one from the other, by a distance equal to the width of one of said interdigitated electrode fingers.

11. The photodetector defined in claim 9 wherein said photodetector further includes container means for enclosing at least said first and second conductive transmission lines in an evacuated atmosphere.

12. The photodetector defined in claim 11 wherein said evacuated atmosphere is maintained at a pressure less than or equal to $2\times 10^{-6}$ torr.

13. The photodetector defined in claim 10 wherein said photodetector further includes container means for enclosing at least said first and second conductive transmission lines in an evacuated atmosphere.

14. The photodetector defined in claim 13 wherein said evacuated atmosphere is maintained at a pressure less than or equal to $2\times10^{-6}$ torr.

15. The photodetector defined in claim 4 wherein said photodetector further includes container means for enclosing at least said first and second conductive transmission lines in an evacuated atmosphere.

16. The photodetector defined in claim 15 wherein said evacuated atmosphere is maintained at a pressure less than or equal to $2\times10^{-6}$ torr.

* * * * *